(12) United States Patent
Shih

(10) Patent No.: US 12,159,803 B2
(45) Date of Patent: Dec. 3, 2024

(54) PROFILE OF DEEP TRENCH ISOLATION STRUCTURE FOR ISOLATION OF HIGH-VOLTAGE DEVICES

(71) Applicant: Taiwan Semiconductor Manufacturing Company, Ltd., Hsin-Chu (TW)

(72) Inventor: Hung-Ling Shih, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/364,646

(22) Filed: Aug. 3, 2023

(65) Prior Publication Data

US 2023/0377950 A1 Nov. 23, 2023

Related U.S. Application Data

(62) Division of application No. 17/389,819, filed on Jul. 30, 2021, now Pat. No. 11,830,765, which is a
(Continued)

(51) Int. Cl.
*H01L 21/76* (2006.01)
*H01L 21/762* (2006.01)
(Continued)

(52) U.S. Cl.
CPC .. *H01L 21/76283* (2013.01); *H01L 21/76802* (2013.01); *H01L 23/5226* (2013.01); *H01L 23/53271* (2013.01)

(58) Field of Classification Search
CPC ......... H01L 21/76283; H01L 21/76802; H01L 23/5226; H01L 23/5327
(Continued)

(56) References Cited

U.S. PATENT DOCUMENTS 9,761,707 B1 9/2017 Lin et al.
10,529,922 B1 * 1/2020 Howard ............. H10N 70/8825
(Continued)

FOREIGN PATENT DOCUMENTS

CN 109427832 A * 3/2019 ....... H01L 27/14601
JP 2013045911 A 3/2013

OTHER PUBLICATIONS

Dao et al. "Improved Deep Trench Isolation Breakdown Voltage for Smart MOS." IEEE Proceedings of 2013 International Conference on IC Design & Technology (ICICDT), published on Aug. 5, 2013.
(Continued)

*Primary Examiner* — Phuc T Dang
(74) *Attorney, Agent, or Firm* — Eschweiler & Potashnik, LLC

(57) ABSTRACT

In some embodiments, the present disclosure relates to a method that includes forming a shallow trench isolation (STI) structure that extends into a substrate. A masking layer is formed over the substrate and includes an opening overlying the STI structure. A first removal process removes portions of the STI structure underlying the opening of the STI structure. A second removal process laterally removes portions of the substrate below the STI structure. A third removal process removes portions of the substrate that directly underlie the opening of the masking layer. An insulator liner layer is formed within inner surfaces of the substrate as defined by the first, second, and third removal processes. Further, a fourth removal process removes portions of the insulator liner layer covering a lower surface of the substrate. A semiconductor material is then formed over the SOI substrate and on the insulator liner layer.

20 Claims, 11 Drawing Sheets

Related U.S. Application Data division of application No. 16/807,632, filed on Mar. 3, 2020, now Pat. No. 11,101,168.

(60) Provisional application No. 62/927,926, filed on Oct. 30, 2019.

(51) Int. Cl.
  *H01L 21/768* (2006.01)
  *H01L 23/522* (2006.01)
  *H01L 23/532* (2006.01)

(58) Field of Classification Search
  USPC .......................................................... 257/506
  See application file for complete search history.

(56) References Cited

U.S. PATENT DOCUMENTS

| | | |
|---|---|---|
| 2001/0012655 A1 | 8/2001 | Nordstrom et al. |
| 2006/0063389 A1 | 3/2006 | Chang et al. |
| 2007/0178660 A1 | 8/2007 | Miller et al. |
| 2008/0258268 A1 | 10/2008 | Cheng |
| 2010/0038751 A1 | 2/2010 | Zhu et al. |
| 2010/0244125 A1 | 9/2010 | Sonsky et al. |
| 2013/0175660 A1 | 7/2013 | Fu et al. |
| 2014/0001555 A1 | 1/2014 | Cheng et al. |
| 2014/0252552 A1 | 9/2014 | Gill et al. |
| 2014/0353795 A1 | 12/2014 | Tong et al. |
| 2015/0270333 A1 | 9/2015 | Yang et al. |
| 2016/0181146 A1 | 6/2016 | Huang |
| 2017/0084646 A1 | 3/2017 | Yang et al. |
| 2017/0170229 A1* | 6/2017 | Oh .................... H01L 27/14603 |
| 2017/0330896 A1 | 11/2017 | See et al. |
| 2018/0068949 A1 | 3/2018 | Chen et al. |
| 2018/0151410 A1 | 5/2018 | Usami |
| 2018/0374842 A1* | 12/2018 | Moen .................... H01L 21/761 |
| 2020/0098798 A1* | 3/2020 | Takahashi ........... H01L 27/1461 |
| 2020/0203478 A1* | 6/2020 | Shank ............... H01L 21/76237 |

OTHER PUBLICATIONS

STMicroelectronics. "BCD (Bipolar-CMOS-DMOS)." The date of publication is unknown. Retrieved online on Oct. 25, 2019 from https://www.st.com/content/st_com/en/about/innovation---technology/BCD.html.

Notice of Allowance dated Apr. 24, 2021 for U.S. Appl. No. 16/807,632.

Non-Final Office Action dated Feb. 21, 2023 for U.S. Appl. No. 17/389,819.

Notice of Allowance dated Jul. 19, 2023 for U.S. Appl. No. 17/389,819.

* cited by examiner

PROFILE OF DEEP TRENCH ISOLATION STRUCTURE FOR ISOLATION OF HIGH-VOLTAGE DEVICES

REFERENCE TO RELATED APPLICATIONS

This Application is a Continuation of U.S. application Ser. No. 17/389,819, filed on Jul. 30, 2021 (now U.S. Pat. No. 11,830,765, issued on Nov. 28, 2023), which is a Divisional of U.S. application Ser. No. 16/807,632, filed on Mar. 3, 2020 (now U.S. Pat. No. 11,101,168, issued on Aug. 24, 2021), which claims the benefit of U.S. Provisional Application No. 62/927,926, filed on Oct. 30, 2019. The contents of the above-referenced Patent Applications are hereby incorporated by reference in their entirety.

BACKGROUND

Modern day integrated chips comprise millions or billions of semiconductor devices formed on a semiconductor substrate (e.g., silicon). Integrated chips (ICs) may use many different types of semiconductor devices, depending on an application of an IC. To reduce the area of the IC, the semiconductor devices may be formed in close proximity to one another. To prevent interference amongst the semiconductor devices, techniques and/or features for device isolation in ICs are being researched. Among other things, deep trench isolation structures are a promising candidate to provide electrical isolation amongst semiconductor devices to improve device performance without sacrificing a large area on the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
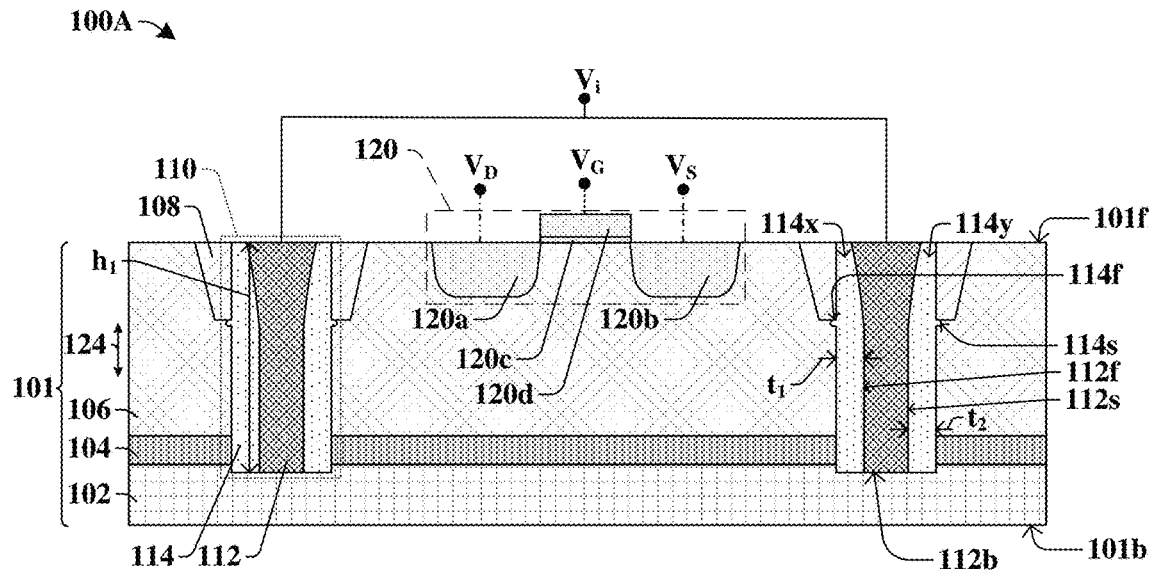
FIGS. 1A and 1B illustrate various views of some embodiments of an integrated chip having a deep trench isolation structure surrounding a semiconductor device and comprising an insulator liner structure covering outermost sidewalls of a semiconductor core structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some applications, more than one semiconductor device may be integrated onto a same substrate. However, current leakage, cross-talk between the semiconductor devices, and/or eventual device performance degradation may become difficult to prevent as device size decreases and voltage operating conditions increase (e.g., greater than 100 Volts). To mitigate current leakage and device performance degradation, in some embodiments, for example, multiple semiconductor devices may be integrated on a silicon-on-insulator (SOI) substrate comprising an insulator layer between an active layer and a base layer. In other embodiments, to arrange semiconductor devices even closer to one another and provide more reliable device isolation, isolation structures may be formed to electrically separate the semiconductor devices from one another. For example, a deep trench isolation (DTI) structure filled with polysilicon may be formed to continuously surround each of the semiconductor devices. The DTI structure may extend into the base layer such that the polysilicon contacts the base layer of the SOI substrate. The polysilicon may be grounded to ground the base layer of the SOI substrate during operation in order to achieve electrical isolation and improve device performance.

To form the DTI structure in, for example, an SOI substrate, a trench extending from a top surface of the active layer and through the insulator layer to expose the base layer is formed. An insulator liner is formed to line the trench. A removal process may be conducted to remove the insulator liner from the base layer of the SOI substrate, while the insulator liner remains on sidewalls of the trench defined by the active layer and the insulator layer of the SOI substrate. However, the removal process may cause upper portions of the insulator liner to reduce in thickness, degrading the effectiveness of the DTI structure. For example, if the insulator liner is too thin, the breakdown voltage of the insulator liner may too small and the insulator liner may breakdown from the voltage bias produced by the semiconductor device during operation.

Various embodiments of the present disclosure are directed towards a method of forming a DTI structure by increasing the thickness of upper portions of an insulator liner such that when a removal process is performed to remove the insulator liner from the base layer of the SOI substrate, a reduction in the thickness of the insulator liner does not impact the DTI structure performance. Thus, in some embodiments, the resulting DTI structure surrounds a semiconductor device and has an insulator liner with a breakdown voltage greater than voltage biases produced by the semiconductor device.

FIG. 1A illustrates a cross-sectional view 100A of some embodiments of an integrated chip having a deep trench isolation (DTI) structure surrounding a semiconductor device.

The integrated chip of FIG. 1A includes a DTI structure 110 embedded within a silicon-on-insulator (SOI) substrate 101. The SOI substrate 101 comprises an insulator layer 104 between a base layer 102 and an active layer 106. In some embodiments, the DTI structure 110 extends from a frontside 101f of the SOI substrate 101, towards a backside 101b of the SOI substrate 101 to a first height $h_1$, and contacts the base layer 102. The first height $h_1$ may be measured in a first direction 124 that is substantially normal to the frontside 101f of the SOI substrate 101. In some embodiments, the first height $h_1$ is in a range of between, for example, approximately 4 micrometers and approximately 8 micrometers. In some embodiments, the integrated chip further comprises a shallow trench isolation (STI) structure 108 extending into the active layer 106 from the frontside 101f of the SOI substrate 101. In such embodiments, the DTI structure 110 may extend completely through the STI structure 108.

The DTI structure 110 comprises an insulator liner structure 114 surrounding outermost sidewalls of a semiconductor core structure 112. A bottommost surface 112b of the semiconductor core structure 112 is uncovered by the insulator liner structure 114 in some embodiments, and the bottommost surface 112b of the semiconductor core structure 112 directly contacts the base layer 102 of the SOI substrate 101. In some embodiments, the insulator liner structure 114 separates the semiconductor core structure 112 from the insulator layer 104, the active layer 106, and the STI structure 108.

In some embodiments, the DTI structure 110 continuously and completely surrounds a semiconductor device 120. The semiconductor device 120 may be, for example, a transistor device such as a metal oxide semiconductor field effect transistor (MOSFET), whereas, in other embodiments, for example, a bipolar complementary metal oxide semiconductor double diffused metal oxide semiconductor (BCD) device comprising multiple transistor devices. Thus, in some embodiments, the semiconductor device 120 may comprise at least a drain region 120a coupled to a drain voltage terminal $V_D$, a source region 120b coupled to a source voltage terminal $V_S$, and a gate electrode 120d arranged over a gate dielectric layer 120c and coupled to a gate voltage terminal $V_G$.

In some embodiments, the semiconductor device 120 may operate at high-voltage conditions, which may be quantified, for example, as greater than 100 Volts. It will be appreciated that other types of semiconductor devices and/or operating voltage values are also within the scope of the disclosure. In some embodiments, the DTI structure 110 may be coupled to an isolation voltage terminal $V_i$. In some embodiments, the isolation voltage terminal $V_i$ may be grounded during operation to ground the semiconductor core structure 112 and base layer 102 to electrically isolate other devices integrated on the SOI substrate 101. In other embodiments, a non-zero voltage bias may be applied to the isolation voltage terminal $V_i$ to electrically isolate other devices integrated on the SOI substrate 101.

Further, in some embodiments, the insulator liner structure 114 comprises a first portion 114x covering a first outermost sidewall 112f of the semiconductor core structure 112 and comprises a second portion 114y covering a second outermost sidewall 112s of the semiconductor core structure 112. In some embodiments, the first portion 114x of the insulator liner structure 114 has a first thickness $t_1$ that varies throughout the first height $h_1$ of the DTI structure 110, and the second portion 114y of the insulator liner structure 114 has a second thickness $t_2$ that varies throughout the first height $h_1$ of the DTI structure 110. In such embodiments, the first portion 114x of the insulator liner structure 114 comprises a first protrusion 114f, and the second portion 114y of the insulator liner structure 114 comprises a second protrusion 114s. The first and second protrusions 114f, 114s may be arranged between the STI structure 108 and the insulator layer 104. In such embodiments, the first and second protrusions 114f, 114s ensure that when the insulator liner structure 114 is not surrounded by the STI structure 108, the insulator liner structure 114 is thick enough to have a high enough breakdown voltage in order to effectively isolate the high voltage biases (e.g., greater than 100 Volts) of the semiconductor device 120 from other devices integrated on the SOI substrate 101. For example, in some embodiments, the first and second thicknesses $t_1$, $t_2$ of the insulator liner structure 114 at least at heights below the STI structure 108 are at least equal to about 5 kiloangstroms to isolate the semiconductor device 120 that operates at high voltages (e.g., greater than 100 Volts).

Figure 1B:
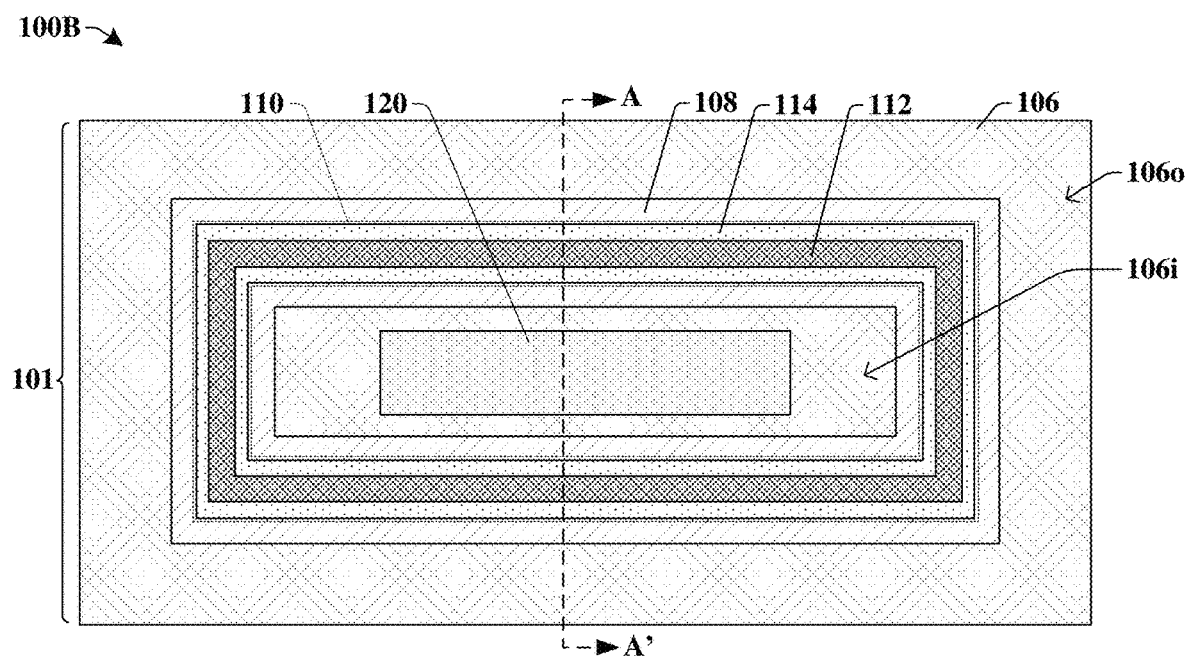

FIG. 1B illustrates a top-view 100B of some embodiments of an integrated chip comprising a DTI structure continuously surrounding a semiconductor device. In some embodiments, the cross-sectional view 100A of FIG. 1A may correspond to cross-section line AA' of FIG. 1B.

As illustrated in the top-view 100B of FIG. 1B, the DTI structure 110 and the STI structure 108 may completely and continuously surround the semiconductor device 120. Further, the DTI structure 110 may continuously separate an inner region 106i of the active layer 106 from an outer region 106o of the active layer 106. In such embodiments, the semiconductor device 120 is arranged on the inner region 106i of the active layer 106, and other devices may be arranged on the outer region 106o of the active layer 106. Thus, the DTI structure 110 and the STI structure 108 may electrically isolate devices on the inner region 106i of the active layer 106 from devices on the outer region 106o of the active layer 106. In some embodiments, the DTI structure 110 exhibits some type of "ring-like" shape, which may mean that it is a continuously connected structure having an inner perimeter and an outer perimeter, for example. Further, in some embodiments, the DTI structure 110 may exhibit a rectangular-ring-like shape, whereas in other embodiments, the DTI structure 110 may exhibit, for example, a circular-ring-like shape, an oval-ring-like shape, or some other geometric-ring-like shape.

FIGS. 2-6 illustrate various cross-sectional views 200-600, respectively, of some alternative embodiments of the first and second protrusions of the insulator liner structure.

Figure 2:
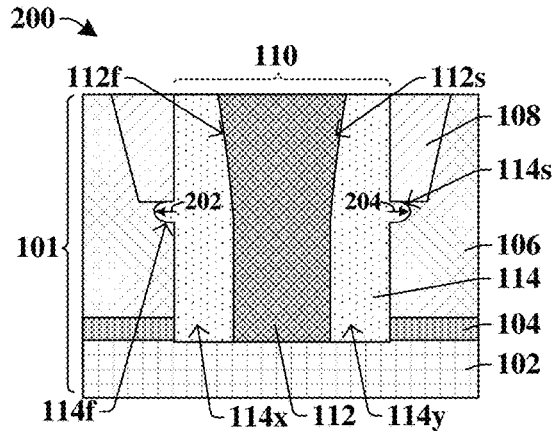
FIGS. 2-6 illustrate cross-sectional views of some various embodiments of a deep trench isolation structure comprising an insulator liner structure covering outermost sidewalls of a semiconductor core structure, wherein the insulator liner structure comprises first and second protrusions.

As illustrated in the cross-sectional view 200 of FIG. 2, in some embodiments, the first and second protrusions 114f, 114s of the insulator liner structure 114 exhibit substantially curved profiles. Further, in some embodiments, the first protrusion 114f of the first portion 114x of the insulator liner structure 114 may extend away from the first outermost sidewall 112f of the semiconductor core structure 112 in a second direction 202 that is different than the first direction (124 of FIG. 1A). In some embodiments, the second direction 202 is perpendicular to the first direction (124 of FIG. 1A). Similarly, in some embodiments, the second protrusion 114s of the second portion 114y of the insulator liner structure 114 may extend away from the second outermost sidewall 112s of the semiconductor core structure 112 in a third direction 204 that is opposite to the second direction 202. Further, in some embodiments, the first and second protrusions 114f, 114s of the insulator liner structure 114 directly underlie the STI structure 108 and directly contact the STI structure 108.

Figure 3:
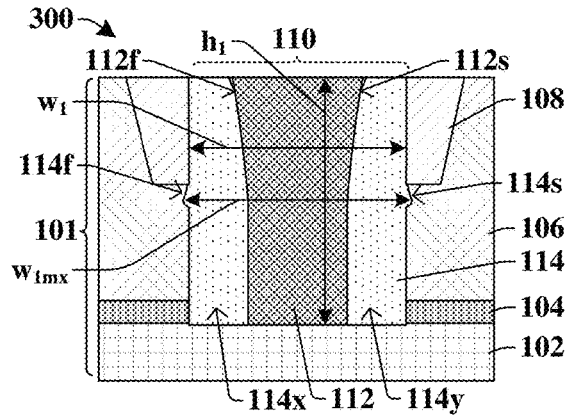

As illustrated in the cross-sectional view 300 of FIG. 3, in some embodiments, the first and second protrusions 114f, 114s of the insulator liner structure 114 may have a rougher profile than the first and second protrusions 114f, 114s illustrated in FIG. 2. For example, in some embodiments, the first and second protrusions 114f, 114s have a substantially smooth, curved profile that exhibits a semi-oval-like profile as in FIG. 2, whereas in other embodiments, such as in FIG. 3, the first and second protrusions 114f, 114s have a more jagged profile comprising some curved and/or planar portions but not exhibiting a commonly shaped (e.g., circle-like, oval-like, elongated rectangle-like, etc.) profile.

Further, the insulator liner structure 114 may have a first width $w_1$ measured in the second and/or third directions (202, 204 of FIG. 2) that varies throughout the first height hi of the DTI structure 110. In some embodiments, the first width $w_1$ includes the first and second thicknesses ($t_1$, $t_2$ of FIG. 1A) of the first and second portions 114x, 114y, respectively, of the insulator liner structure 114 and also includes the semiconductor core structure 112. In some embodiments, a maximum first width $w_{1mx}$ of the insulator liner structure 114 includes the first and second protrusions 114f, 114s of the insulator liner structure 114. Further, in some embodiments, the maximum first width $w_{1mx}$ of the insulator liner structure 114 is a maximum value of the first width $w_1$, is located at a height between the STI structure 108 and the insulator layer 104 of the SOI substrate 101, is measured in the second and/or third directions (202, 204 of FIG. 2), and includes the first portion 114x and the second portion 114y of the insulator liner structure 114. A minimum width of the insulator liner structure 114 may be a minimum width of the first width $w_1$ and thus, the minimum width of the insulator liner structure 114 is also measured in the second and/or third directions (202, 204 of FIG. 2) and includes the first portion 114x and the second portion 114y of the insulator liner structure 114. In some embodiments, the maximum first width $w_{1max}$ of the insulator liner structure 114 is greater than a minimum width of the insulator liner structure 114 by at least 400 angstroms to ensure that the insulator liner structure 114 arranged below the STI structure 108 is thick enough to have a high enough breakdown voltage to effectively isolate the semiconductor device (120 of FIG. 1A) from other devices integrated on the SOI substrate 101.

Figure 4:
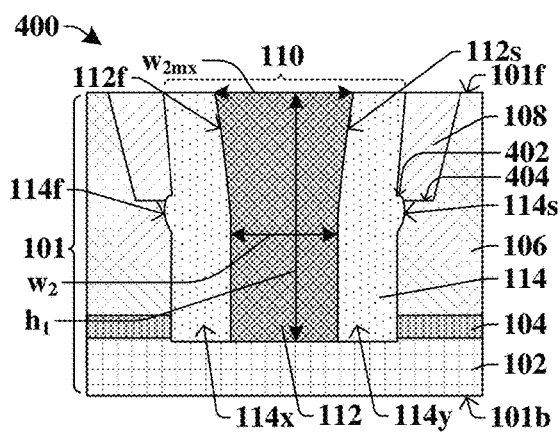

As illustrated in the cross-sectional view 400 of FIG. 4, in some embodiments, at least the second protrusion 114s of the insulator liner structure 114 has a topmost surface 402 that is above a bottommost surface 404 of the STI structure 108. In such embodiments, portions of the first and second protrusions 114f, 114s are still arranged below the STI structure 108 to ensure that portions of the insulator liner structure 114 arranged below the STI structure 108 effectively isolate the semiconductor device (120 of FIG. 1A) from other devices integrated on the SOI substrate 101.

Further, in some embodiments, the semiconductor core structure 112 may have a second width $w_2$ measured in the second and/or third directions (202, 204 of FIG. 2) that varies throughout the first height $h_1$ of the DTI structure 110. The second width $w_2$ may be measured between the first outermost sidewall 112f and the second outermost sidewall 112s of the semiconductor core structure 112. In some embodiments, the second width $w_2$ continuously decreases as the second width $w_2$ is measured at various heights from the frontside 101f of the SOI substrate 101 to the backside 101b of the SOI substrate 101. Thus, in some embodiments, a maximum second width $w_{2mx}$ of the semiconductor core structure 112 is a maximum value of the second width $w_2$ and is measured at a topmost surface of the semiconductor core structure 112. In some embodiments, the second width $w_2$ is in a range of between, for example, approximately 1 micrometer and approximately 1.5 micrometers. It will be appreciated that other values for the second width $w_2$ are also within the scope of the disclosure.

Figure 5:
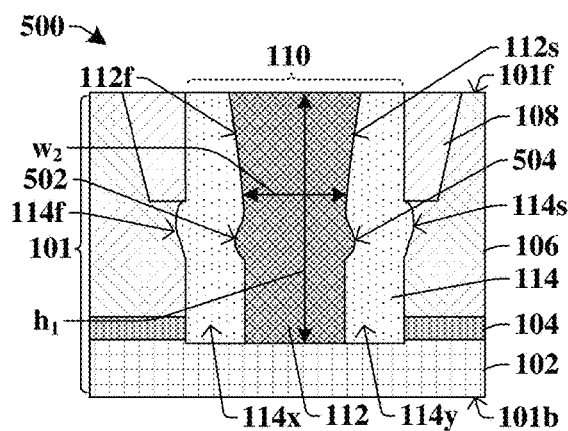

As illustrated in the cross-sectional view 500 of FIG. 5, in some embodiments, the semiconductor core structure 112 may also comprise a first protrusion 502 and a second protrusion 504. In such embodiments, the first protrusion 502 of the semiconductor core structure 112 may be arranged on the first outermost sidewall 112f of the semiconductor core structure 112 and extend outward in the second direction (202 of FIG. 2), and the second protrusion 504 of the semiconductor core structure 112 may be arranged on the second outermost sidewall 112s of the semiconductor core structure 112 and extend outward in the third direction (204 of FIG. 2). In such embodiments, the first and second protrusions 502, 504 of the semiconductor core structure 112 may be arranged at a height between the STI structure 108 and the insulator layer 104 of the SOI substrate 101. In such embodiments, the second width $w_2$ may not continuously decrease as the second width $w_2$ is measured at various heights from the frontside 101f of the SOI substrate 101 to the backside 101b of the SOI substrate 101.

Figure 6:
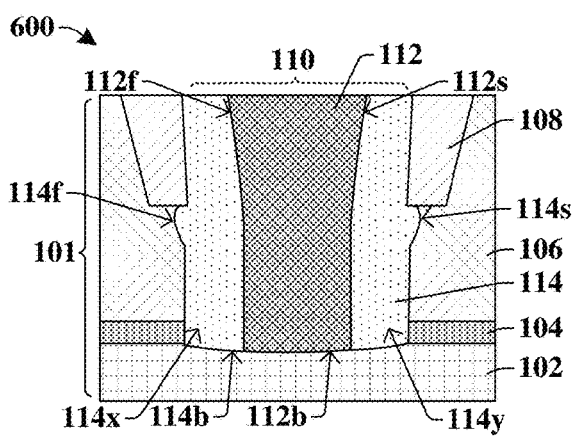

As illustrated in the cross-sectional view 600 of FIG. 6, in some embodiments, the DTI structure 110 may have overall curved bottom surfaces. For example, in some embodiments, the bottommost surface 112b of the semiconductor core structure 112 and bottommost surfaces 114b of the insulator liner structure 114 are substantially curved. In some embodiments, the bottommost surface 112b of the semiconductor core structure 112 is arranged below bottommost surfaces 114b of the insulator liner structure 114.

Figure 7:
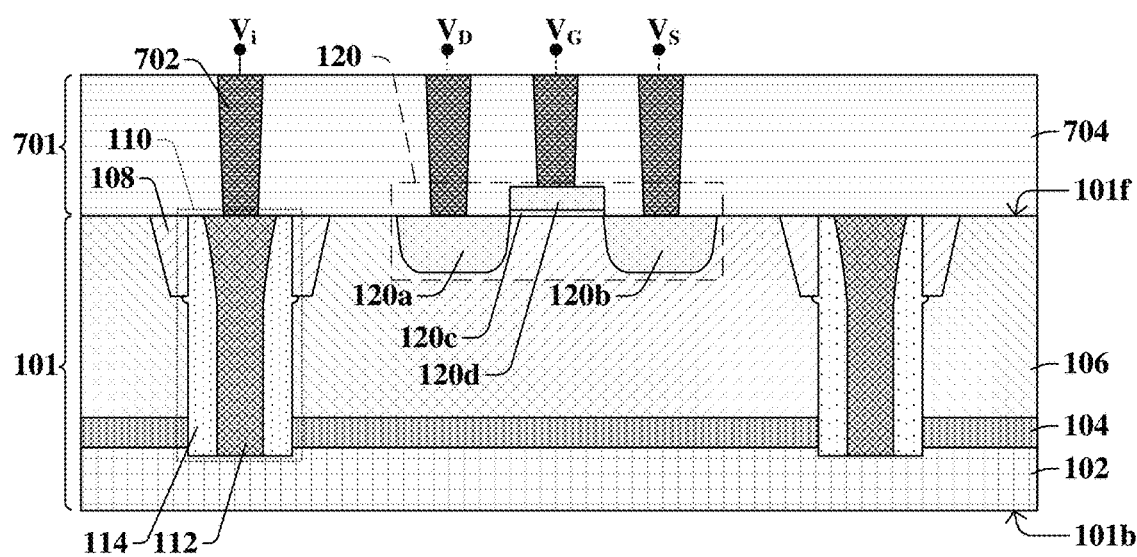
FIG. 7 illustrates a cross-sectional view of some additional embodiments of an integrated chip having a deep trench isolation structure coupled to a contact via.

FIG. 7 illustrates a cross-sectional view 700 of some embodiments of an integrated chip comprising the DTI structure and semiconductor device coupled to contact vias.

In some embodiments, a lower interconnect structure 701 overlies the SOI substrate 101, and contact vias 702 are disposed within a dielectric structure 704. At least one of the contact vias 702 may be coupled to the semiconductor core structure 112 of the DTI structure 110. Further, the contact vias 702 may couple the drain region 120a of the semiconductor device 120 to the drain voltage terminal $V_D$, the gate electrode 120d of the semiconductor device 120 to the gate voltage terminal $V_G$, and the source region 120b of the semiconductor device 120 to the source voltage terminal $V_S$. In some embodiments, networks of interconnect vias and wires (not shown) are coupled to the contact vias 702.

In some embodiments, the dielectric structure 704 comprises, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the contact vias 702 comprise, for example, copper, tungsten, aluminum, or some other conductive material.

Further, in some embodiments, the semiconductor core structure 112, the base layer 102, and the active layer 106 may each comprise a semiconductor material, such as, for example, silicon, germanium, or the like. For example, in some embodiments, the base layer 102 may comprise monocrystalline silicon, the active layer 106 may comprise doped silicon, and the semiconductor core structure 112 may comprise polysilicon. In some embodiments, the insulator liner structure 114, the insulator layer 104, and the STI structure 108 may each comprise an insulator and/or dielectric material, such as, for example, silicon dioxide, silicon nitride, germanium oxide, silicon oxynitride, or the like. For example, in some embodiments, the insulator liner structure 114 and the STI structure 108 may comprise a same material, such as silicon dioxide, whereas the insulator layer 104 may comprise a different material, such as germanium oxide. In some other embodiments, the insulator liner structure 114, the STI structure 108, and the insulator layer 104 may each comprise the same materials or may each comprise different materials. Further, the STI structure 108, the insulator layer 104, and/or the insulator liner structure 114 may comprise insulator materials and structures (e.g., thicknesses) that have breakdown voltages greater than voltage biases (e.g., greater than 100 Volts) produced by the semiconductor device 120 to mitigate leakage from the semiconductor device 120 during operation.

FIGS. 8A-18 illustrate various views 800A-1800 of some embodiments of a method of forming an integrated chip having a deep trench isolation (DTI) structure. Although FIGS. 8A-18 are described in relation to a method, it will be appreciated that the structures disclosed in FIGS. 8A-18 are not limited to such a method, but instead may stand alone as structures independent of the method.

As shown in cross-sectional view 800A, in some embodiments, a silicon-on-insulator (SOI) substrate 101 is provided. In some embodiments, the SOI substrate 101 comprises a base layer 102, an active layer 106 arranged over the base layer 102, and an insulator layer 104 arranged between the active layer 106 and the base layer 102. In some embodiments, the base layer 102 comprises a monocrystalline semiconductor material (e.g., silicon, germanium, etc.). Similarly, the active layer 106 may also comprise a semiconductor material, such as for example, silicon, germanium, or the like. In some embodiments, the active layer 106 may comprise p-type silicon, for example. In some other embodiments, the SOI substrate 101 may be some other type of substrate and comprise any type of semiconductor body (e.g., silicon/CMOS bulk, SiGe, etc.).

In some embodiments, the active layer 106 has a thickness in a range of between, for example, approximately 6.5 micrometers and approximately 7.5 micrometers. In other embodiments, the active layer 106 has a thickness equal to approximately 7 micrometers. In some embodiments, the insulator layer 104 may be a bulk oxide comprising, for example, silicon oxide. In other embodiments, the insulator layer 104 may comprise, for example, a nitride, a carbide, or some other dielectric material. The insulator layer 104 may have a thickness in a range of between, for example, approximately 0.2 micrometers and approximately 0.4 micrometers. In other embodiments, the insulator layer 104 may have a thickness equal to approximately 0.3 micrometers.

In some embodiments, a shallow trench isolation (STI) structure 108 is formed within the SOI substrate 101. The STI structure 108 may extend from a frontside 101f of the SOI substrate 101 and towards a backside 101b of the SOI substrate 101. The STI structure 108 may, in some embodiments, extend into the active layer 106 to a depth of approximately 1500 angstroms, for example. In other embodiments, the STI structure 108 may extend into the active layer 106 to a depth in a range of between, for example, approximately 350 nanometers and approximately 400 nanometers. It will be appreciated that other values are also within the scope of the disclosure.

In some embodiments, the STI structure 108 is formed by various steps of photolithography, removal, and/or deposition processes such that the STI structure 108 comprises a dielectric material. For example, in some embodiments, the STI structure 108 may comprise silicon dioxide. In other embodiments, the STI structure 108 may be formed by a selective ion implantation process such that the STI structure 108 has a different dopant concentration than the active layer 106.

Figure 8A:
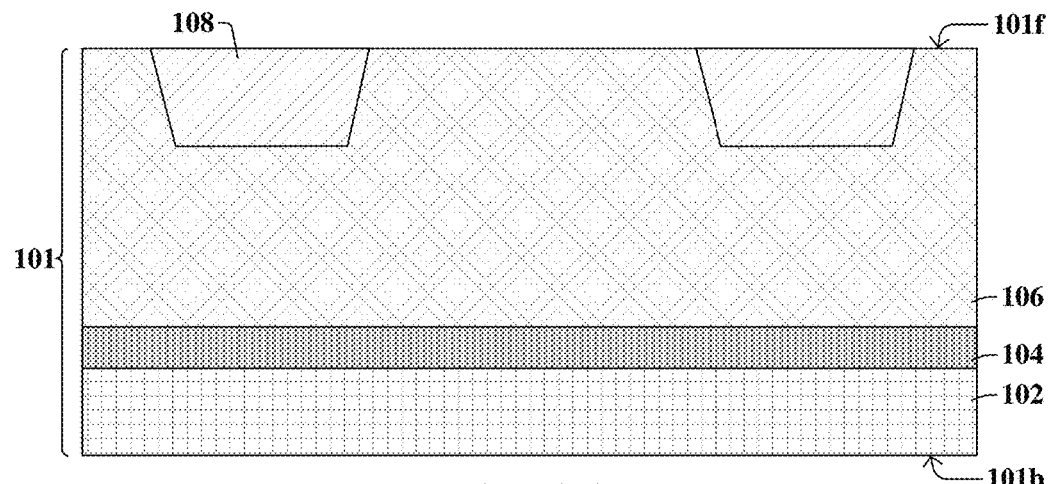
FIGS. 8A-18 illustrate various views of some embodiments of a method of forming a deep trench isolation structure in a substrate that comprises an isotropic etch to increase the width and thus reliability of an insulator liner structure of the deep trench isolation structure.
Figure 8B:
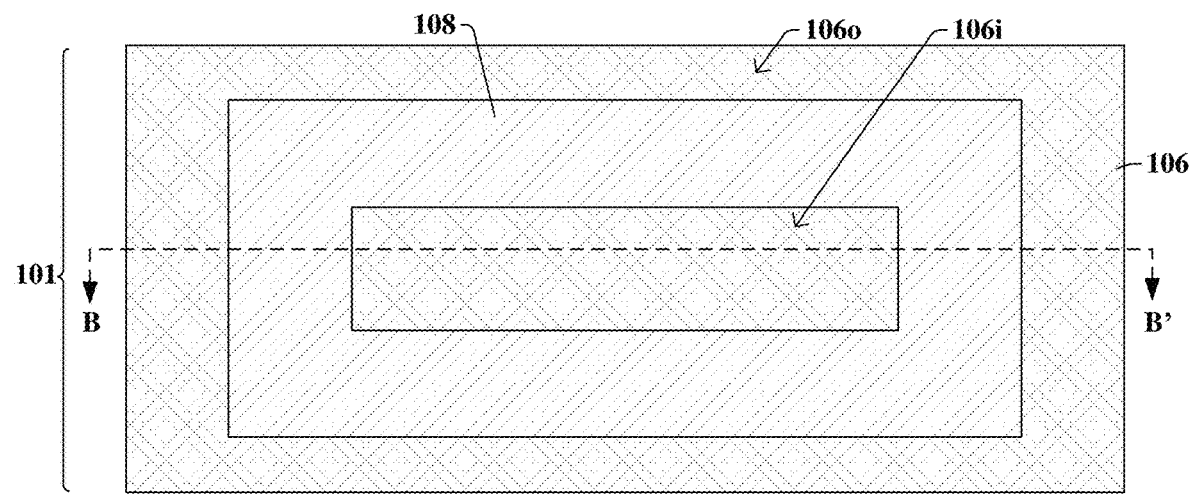

FIG. 8B illustrates a top-view 800B of some embodiments of the STI structure 108 arranged over the active layer 106 of the SOI substrate 101. In some embodiments, the cross-sectional view 800A of FIG. 8A may correspond to cross-section line BB' of FIG. 8B.

As shown in the top-view 800B of FIG. 8B, in some embodiments, the STI structure 108 is a continuously connected ring-like structure. From the top-view 800B, the STI structure 108 may continuously separate an inner region 106i of the active layer 106 from an outer region 106o of the active layer 106.

Figure 9:
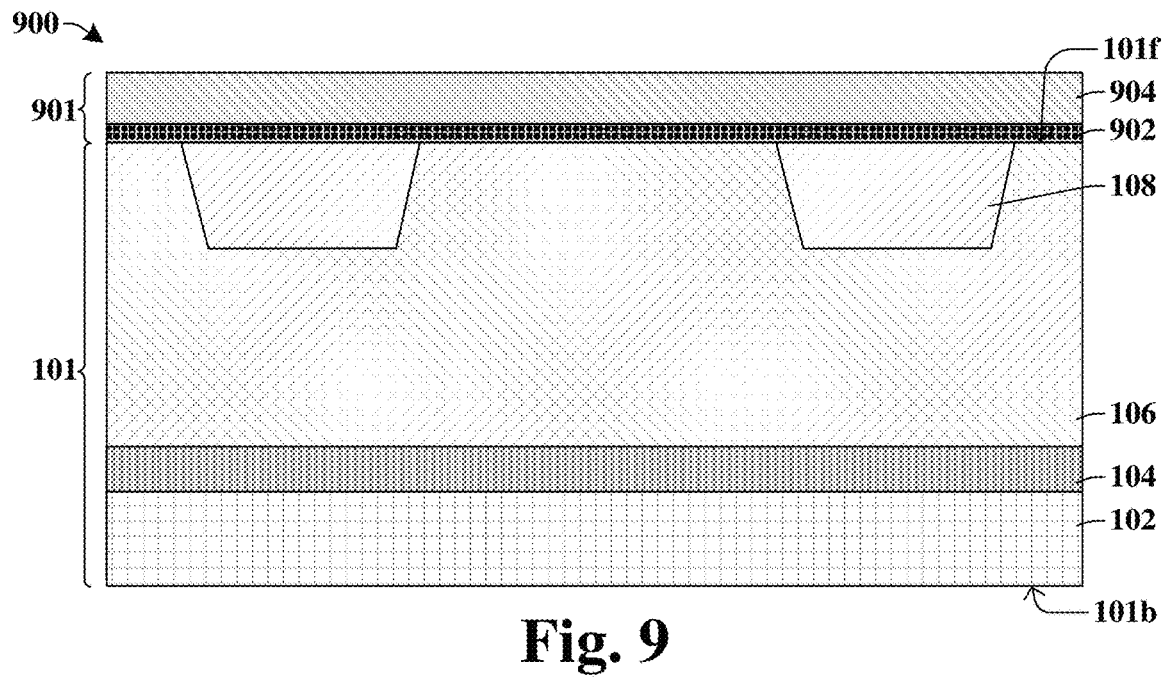

As shown in cross-sectional view 900 of FIG. 9, in some embodiments, a protection structure 901 is formed over the frontside 101f of the SOI substrate 101. The protection structure 901 may be used, for example, for patterning and also for protection of the SOI substrate 101. In some embodiments, the protection structure 901 comprises one or more hard mask layers (e.g., a silicon nitride layer, a silicon carbide layer, or the like). For example, in some embodiments, the protection structure 901 may comprise a nitride layer 902 arranged over the frontside 101f of the SOI substrate 101 and an oxide layer 904 arranged over the nitride layer 902. In some embodiments, the nitride layer 902 comprises silicon nitride, and the oxide layer 904 comprises silicon dioxide. In some other embodiments, the protection structure 901 may comprise more or less layers and/or may comprise different materials.

In some embodiments, the nitride layer 902 may have a thickness in a range of between, for example, approximately 150 nanometers and approximately 200 nanometers. In some embodiments, the oxide layer 904 may have a thickness in a range of between, for example, approximately 950 nanometers and approximately 1000 nanometers. It will be appreciated that other values are also within the scope of the disclosure. In some embodiments, the nitride layer 902 and/or the oxide layer 904 of the protection structure 901 may be formed by one or more deposition techniques (e.g., physical vapor deposition (PVD), chemical vapor deposition (CVD), PE-CVD, atomic layer deposition (ALD), sputtering, etc.). In some other embodiments, the oxide layer 904 may be formed by a thermal oxidation process.

Figure 10:
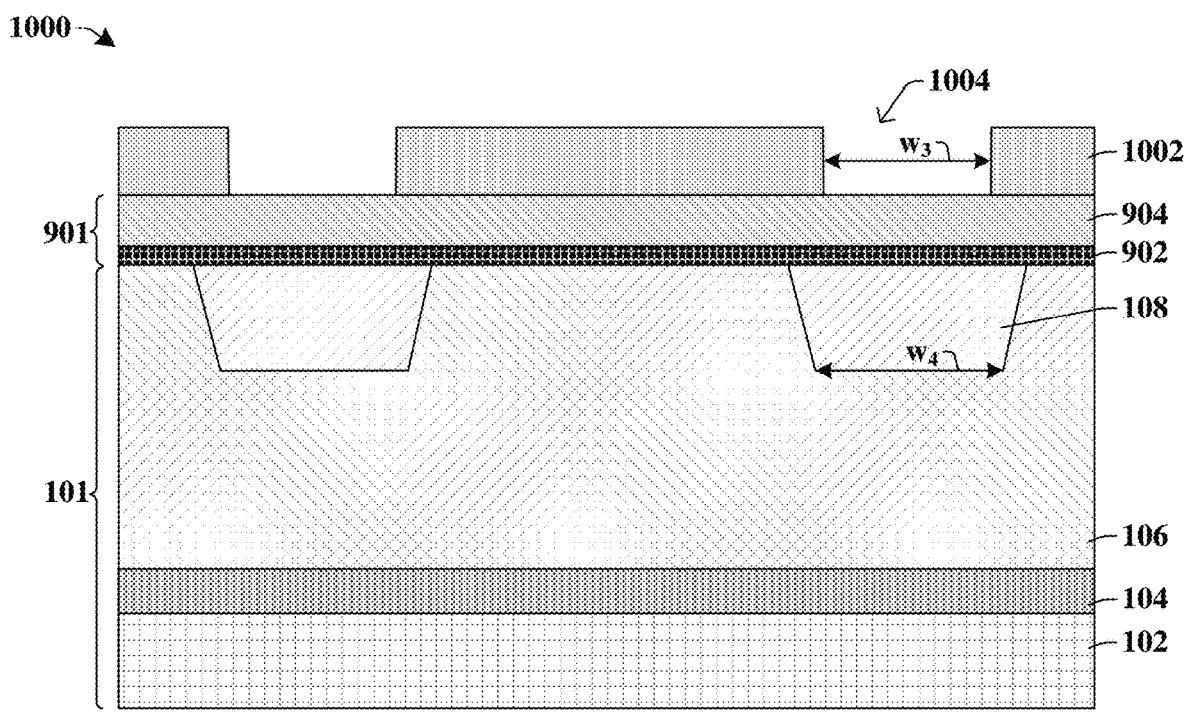

As shown in cross-sectional view 1000 of FIG. 10, a masking layer 1002 is formed over the protection structure 901. The masking layer 1002 comprises an opening 1004 that directly overlies the STI structure 108. In some embodiments, the opening 1004 has a third width $w_3$ that is less than a fourth width $w_4$ of the STI structure 108. In some embodiments, the fourth width $w_4$ of the STI structure 108 is a minimum width of the STI structure 108. In other embodiments, the fourth width $w_4$ of the STI structure 108 may be greater than a minimum width of the STI structure 108. In some embodiments, the masking layer 1002 comprises a photoresist material deposited via a spin coating process. The masking layer 1002 may then be selectively exposed to electromagnetic radiation according to a photomask. The electromagnetic radiation modifies a solubility of exposed regions within the masking layer 1002 to define soluble regions. The masking layer 1002 is subsequently developed to define the opening 1004 after removing the soluble regions As shown in cross-sectional view 1100 of FIG. 11, in some embodiments, a first removal process 1102 is performed to remove portions of the protection structure 901 and the STI structure 108 that directly underlie the opening 1004 of the masking layer 1002. In some embodiments, the first removal process 1102 comprises a dry etching process that is conducted in a substantially vertical direction. In some embodiments, a same dry etchant is used during the first removal process 1102 to remove the oxide layer 904, the nitride layer 902, and the STI structure 108, whereas in other embodiments, more than one dry etchant may be used in the first removal process 1102 to remove the oxide layer 904, the nitride layer 902, and the STI structure 108. Nevertheless, in such embodiments, after the first removal process 1102, portions of the active layer 106 arranged directly below the opening 1004 of the masking layer 1002 are exposed.

As shown in cross-sectional view 1200 of FIG. 12, in some embodiments, a second removal process 1202 is performed to laterally remove portions of the active layer 106 arranged below the STI structure 108. In some embodiments, the second removal process 1202 is an isotropic etching process that uses a dry etchant. In such embodiments, the second removal process 1202 may laterally and vertically remove portions of the active layer 106 of the SOI substrate 101. In some embodiments, the second removal process 1202 laterally removes at least a first distance $d_1$ of the active layer 106. The first distance $d_1$ may be measured from an inner sidewall 108s of the STI structure 108 formed by the first removal process (1102 of FIG. 11) to an inner sidewall 106s of the active layer 106 formed by the second removal process 1202. In some embodiments, the first distance $d_1$ is at least equal to about 200 angstroms. In some other embodiments, the first distance $d_1$ is in a range of between approximately 500 angstroms and approximately 1000 angstroms, for example. Further, in some embodiments, as a result of the second removal process 1202 being an isotropic etching process, the second removal process 1202 vertically removes at least a second distance $d_2$ of the active layer 106 of the SOI substrate 101 arranged directly below the STI structure 108. In some embodiments, the second distance $d_2$ may be greater than 100 nanometers, for example. It will be appreciated that other values for the first and second distances $d_1$, $d_2$ are also within the scope of the disclosure. For example, in some embodiments, the second distance $d_2$ may be about equal to the first distance $d_1$ if the second removal process 1202 has a constant rate of removal of the active layer 106 in all directions. In some other embodiments, the second distance $d_2$ may be greater than or less than the first distance di if the rate of removal of the active layer 106 is different in the lateral direction than in the vertical direction.

In some embodiments, the second removal process 1202 uses a dry etchant that removes the active layer 106 of the SOI substrate 101, but does not remove the STI structure 108. In other embodiments, some portions of the STI structure 108 may be removed as a residual result of the second removal process 1202. In some embodiments, the dry etchant used in the second removal process 1202 may comprise, for example, a gaseous mixture of xenon and fluoride (e.g., $XeF_6$), sulfur and fluoride (e.g., $SF_6$), or some other suitable mixture (e.g., gaseous mixture, wet mixture) that isotopically removes portions of the active layer 106. Further, in some embodiments, the composition of the gaseous mixture, the concentration of the gaseous mixture and/or the time of the second removal process 1202 may be adjusted to control the first and second distances $d_1$, $d_2$ formed by the second removal process 1202. For example, in some embodiments, for the breakdown voltage of the insulator liner structure (see., 114 of FIG. 18) to be greater than voltages produced by the semiconductor device (see, 120 of FIG. 18), the first distance $d_1$ of FIG. 12 that is formed by the second removal process 1202 is equal to at least 500 angstroms. Thus, the time of the second removal process 1202 may be adjusted such that the first distance $d_1$ is equal to at least 500 angstroms, thereby ensuring that the insulator liner structure (see, 114 of FIG. 18) electrically isolates the semiconductor device (see, 120 of FIG. 18) from other devices on the SOI substrate 101.

Figure 13A:
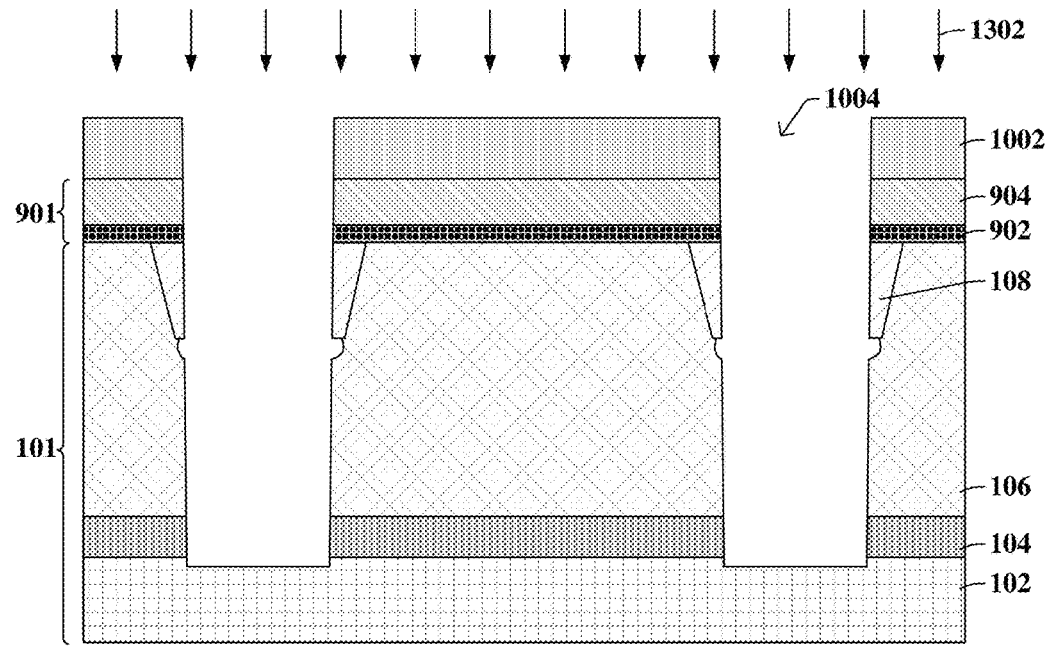

As shown in cross-sectional view 1300A of FIG. 13A, in some embodiments, a third removal process 1302 is performed to remove remaining portions of the active layer 106 that directly underlie the opening 1004 of the masking layer 1002. The third removal process 1302 also removes portions of the insulator layer 104 of the SOI substrate 101 that directly underlie the opening 1004 of the masking layer 1002 to expose the base layer 102 of the SOI substrate 101. In some embodiments, the third removal process 1302 removes upper portions of the base layer 102 that directly underlie the opening 1004 of the masking layer 1002. In some embodiments, the third removal process 1302 is or comprises a dry etching process conducted in a substantially vertical direction. In some embodiments, a same dry etchant is used during the third removal process 1302 to remove the active layer 106, the insulator layer 104, and in some embodiments, the base layer 102. In other embodiments, more than one dry etchant may be used in the third removal process 1302 to remove the active layer 106, the insulator layer 104, and in some embodiments, the base layer 102. Nevertheless, in such embodiments, after the third removal process 1302, portions of the active layer 106 and the insulator layer 104 arranged directly below the opening 1004 of the masking layer 1002 are removed, and the base layer 102 of the SOI substrate 101 is exposed.

Figure 13B:
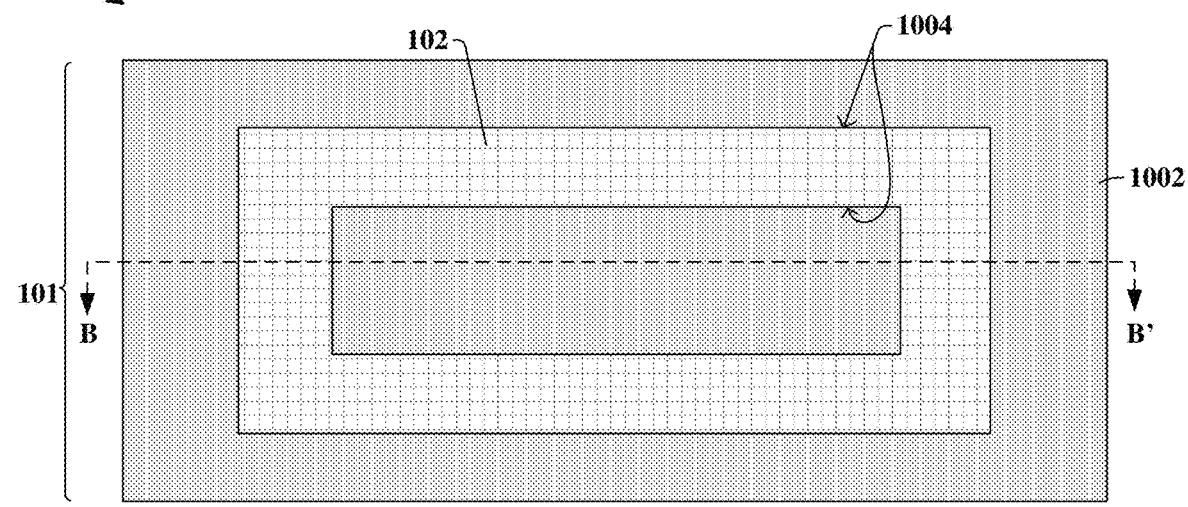

FIG. 13B illustrates a top-view 1300B of some embodiments of the exposed portions of the base layer 102 after the third removal process (1302 of FIG. 13A). In some embodiments, the cross-sectional view 1300A of FIG. 13A may correspond to cross-section line BB' of FIG. 13B.

As shown in the top-view 1300B of FIG. 13B, in some embodiments, the opening 1004 of the masking layer 1002 is a continuously connected ring-like structure. Thus, the exposed portions of the base layer 102 illustrated in FIG. 13B also exhibit a continuously connected ring-like structure.

Figure 11:
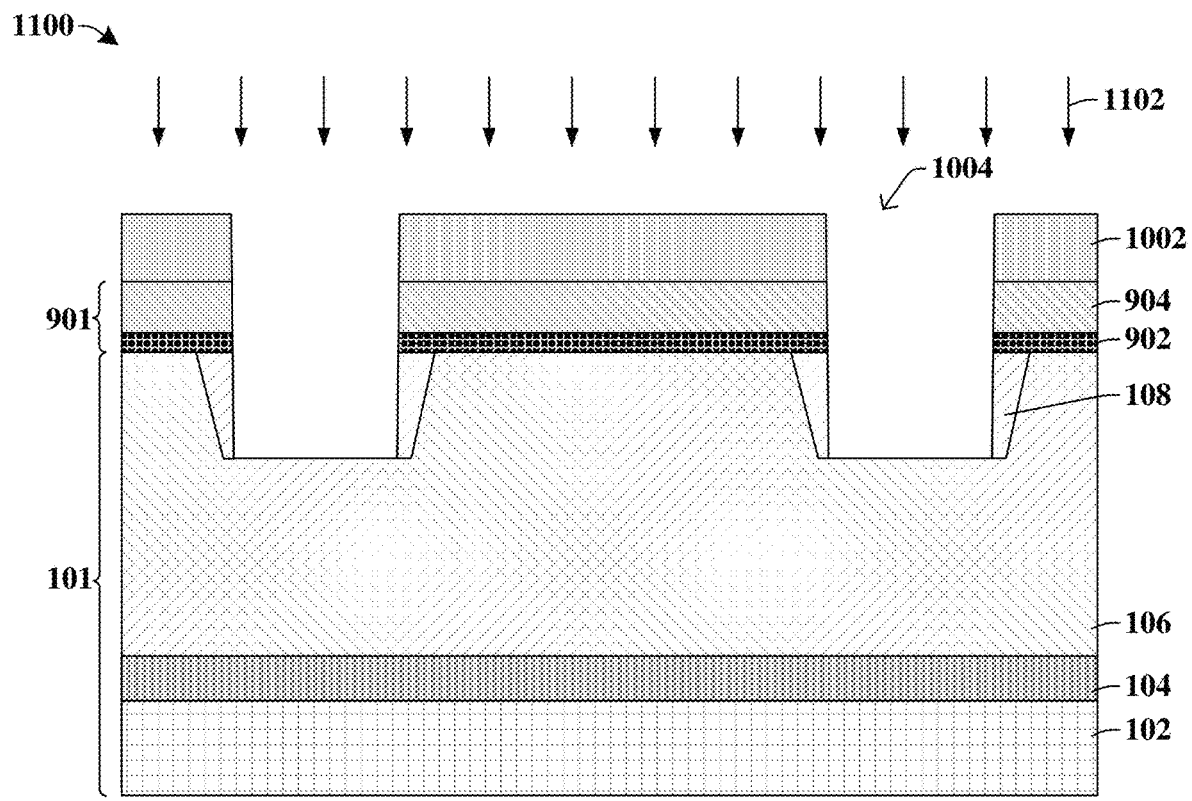
Figure 12:
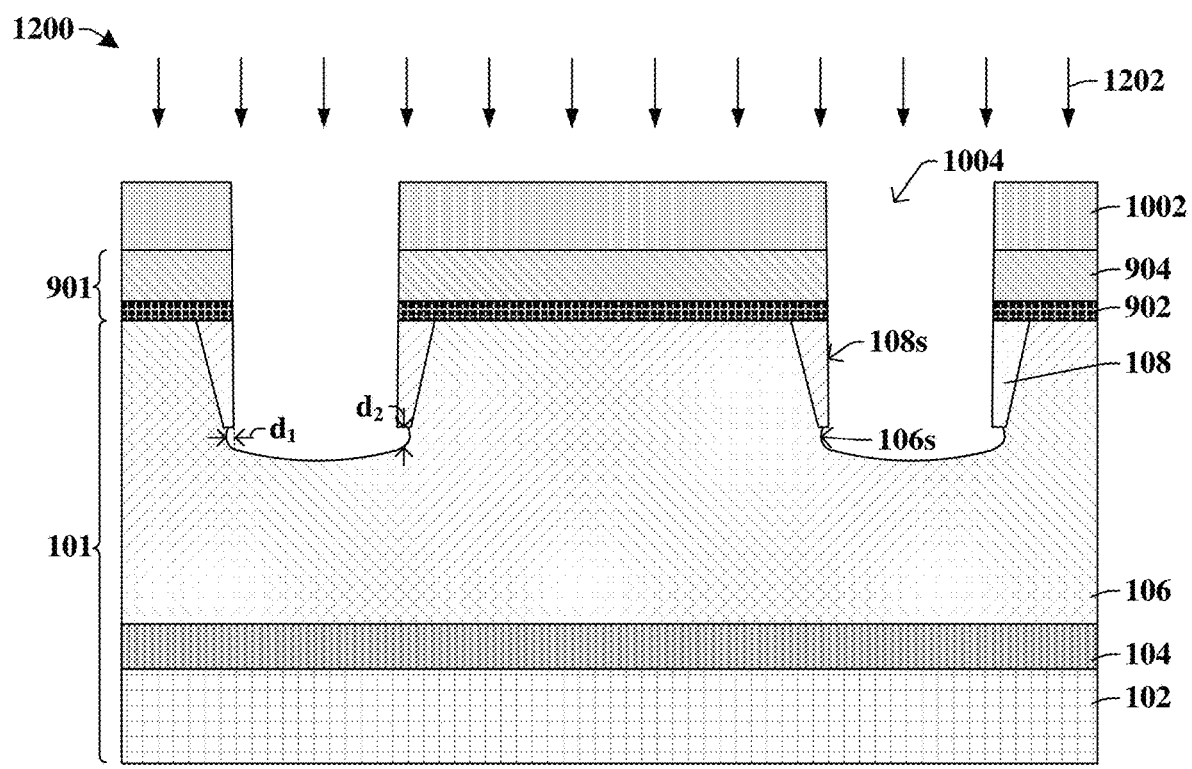
Figure 14:
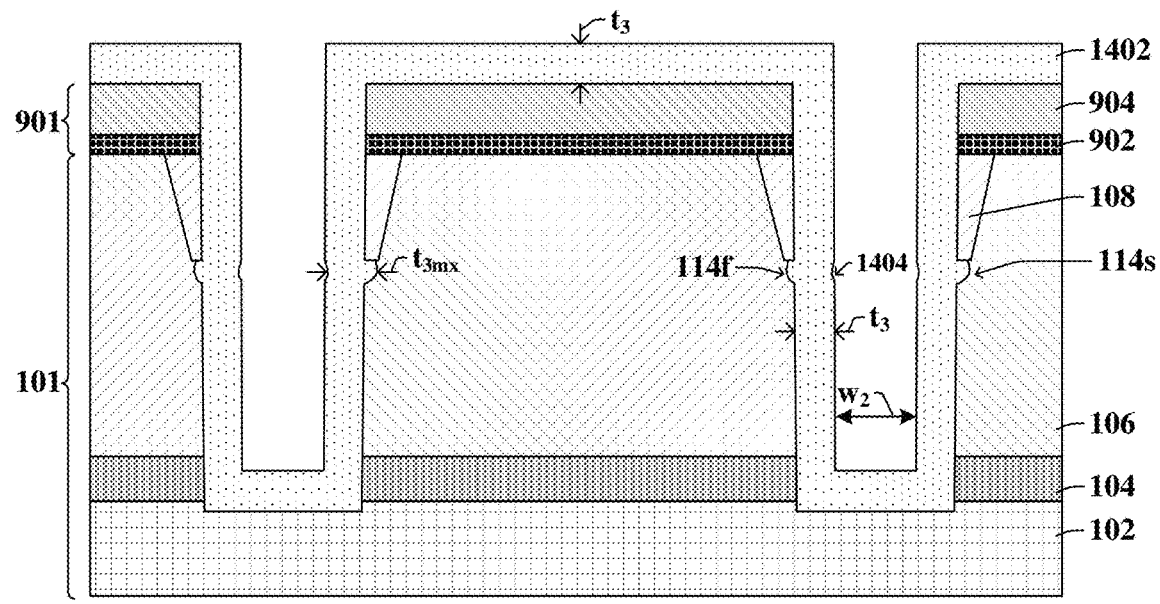

As shown in cross-sectional view 1400 of FIG. 14, in some embodiments, an insulator liner layer 1402 is formed over the SOI substrate 101 and within inner surfaces of the STI structure 108, the active layer 106, the insulator layer 104, and the base layer 102 as defined by the first, second, and third removal processes (1102 of FIG. 11, 1202 of FIG.

12, 1302 of FIG. 13A). In some embodiments, prior to the formation of the insulator liner layer 1402, the masking layer (1002 of FIG. 13A) is removed. In other embodiments, the masking layer (1002 of FIG. 13A) may not be removed, and thus, be present between the oxide layer 904 and the insulator liner layer 1402 in FIG. 14.

In some embodiments, the insulator liner layer 1402 is formed in a furnace chamber by a thermal growth process. In some other embodiments, the insulator liner layer 1402 may be formed by a deposition process (e.g., CVD, PE-CVD, ALD, or the like). In some embodiments, the insulator liner layer 1402 may comprise an oxide, such as, for example, silicon oxide. In other embodiments, the insulator liner layer 1402 may comprise some other dielectric material such as silicon carbide, silicon oxide, or silicon oxynitride, for example. Further, in some embodiments, the insulator liner layer 1402 may have a third thickness $t_3$ that is equal to at least 5 kiloangstroms, for example. In some embodiments, a space having a second width $w_2$ remains between portions of the insulator liner layer 1402 covering the inner surfaces of the STI structure 108, the active layer 106, the insulator layer 104, and the base layer 102. In some embodiments, the second width $w_2$ is in a range of between, for example, approximately 1 micrometer and approximately 1.5 micrometers. For example, in some embodiments, the second width $w_2$ is equal to about 1.2 micrometers.

In some embodiments, because of the second removal process (1202 of FIG. 12), the insulator liner layer 1402 comprises a first protrusion 114f and a second protrusion 114s arranged between the STI structure 108 and the insulator layer 104. In some embodiments, the insulator liner layer 1402 has a maximum third thickness $t_{3mx}$ at the first and/or second protrusions 114f, 114s. For example, in some embodiments, the maximum third thickness $t_{3mx}$ is a maximum value of the third thickness $t_3$ of the insulator liner layer 1402 and is equal to at least 5.2 angstroms. It will be appreciated that other values of the third thickness $t_3$ and maximum third thickness $t_{3mx}$ are also within the scope of the disclosure. Further, in some embodiments, the insulator liner layer 1402 comprises indents 1404 laterally beside the first and second protrusions 114f, 114s. In such embodiments, the indents 1404 are a result of the formation of the insulator liner layer 1402 over the first and second protrusions 114f, 114s. In other embodiments, the indents 1404 may not be present in the insulator liner layer 1402.

Figure 15:
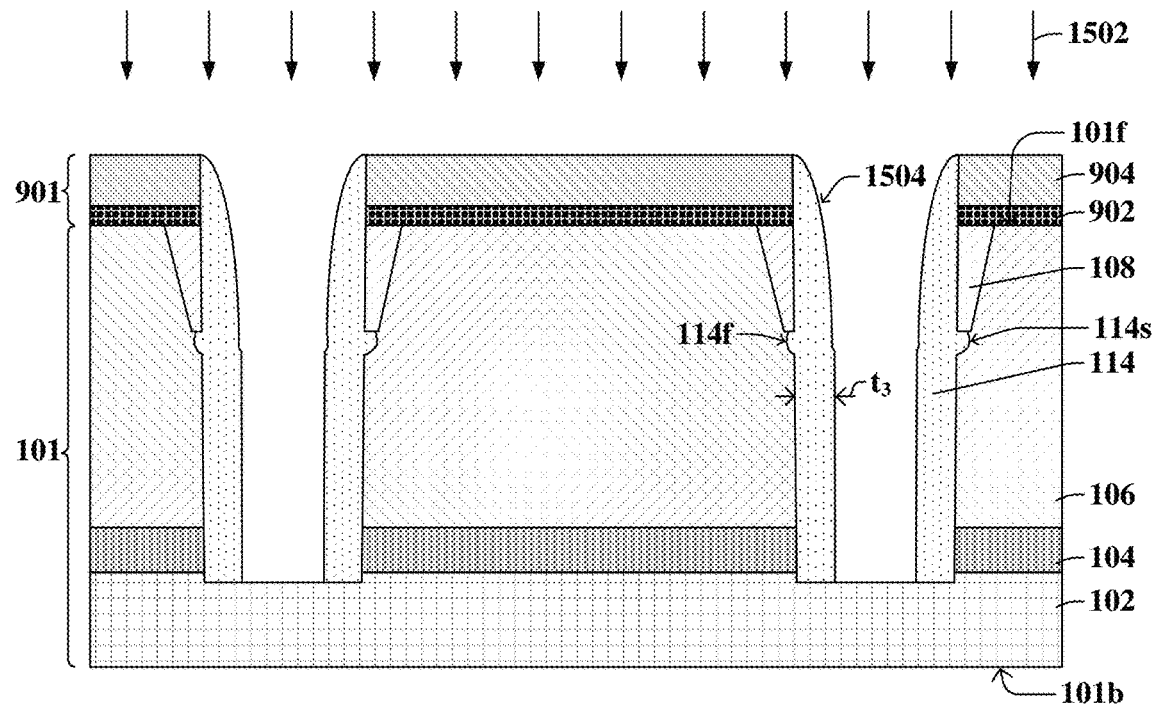

As shown in cross-sectional view 1500 of FIG. 15, in some embodiments, a fourth removal process 1502 is performed to remove portions of the insulator liner layer (1402 of FIG. 14) arranged over the base layer 102 to form an insulator liner structure 114. In such embodiments, the fourth removal process 1502 may also remove portions of the insulator liner layer (1402 of FIG. 14) arranged over the protection structure 901. After the fourth removal process 1502, in some embodiments, the base layer 102 of the SOI substrate 101 is exposed. Further, after the fourth removal process 1502, although the base layer 102 is exposed, portions of the insulator liner structure 114 still contact and cover portions of the base layer 102. In some embodiments, the protection structure 901 may decrease in height due to residual effects of the fourth removal process 1502. However, after the fourth removal process 1502, the protection structure 901 may still cover and protect the SOI substrate 101. In some embodiments, after the fourth removal process 1502, the indents (1404 of FIG. 14) in the insulator liner structure 114 are reduced or eliminated. In other embodiments, the indents (1404 of FIG. 14), if present, are unaffected by the fourth removal process 1502.

In some embodiments, the fourth removal process 1502 is conducted in a substantially vertical direction. Further, in some embodiments, the fourth removal process 1502 is an etching process that uses a dry etchant, and a masking layer is not needed. In some embodiments, the fourth removal process 1502 also removes upper portions of the insulator liner layer (1402 of FIG. 14), such that the insulator liner structure 114 comprises curved upper sidewalls 1504. In other words, the third thickness $t_3$ of the insulator liner structure 114 may be larger near the backside 101b of the SOI substrate 101 than near the frontside 101f of the SOI substrate 101. Thus, the third thickness $t_3$ of the insulator liner structure 114 may decrease in upper portions of the insulator liner structure 114 after the fourth removal process 1502. In such embodiments, the STI structure 108 and the first and second protrusions 114f, 114s as a result of the second removal process (1202 of FIG. 2) ensure that the decrease in the third thickness $t_3$ in the upper portions of the insulator liner structure 114 do not degrade final device performance.

Figure 16:
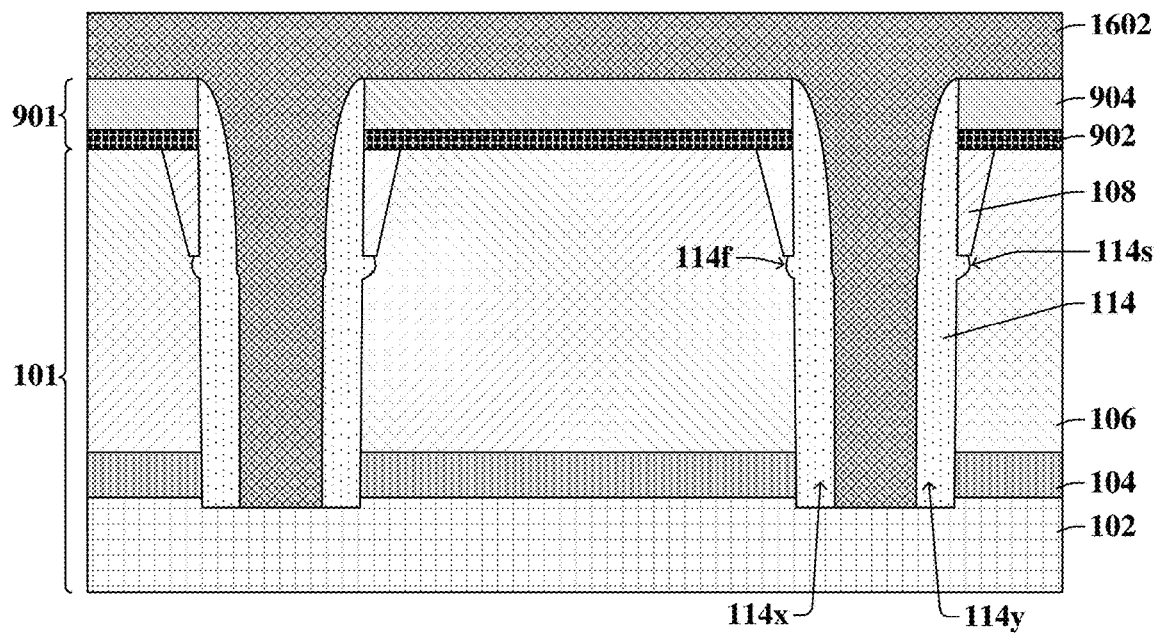

As shown in cross-sectional view 1600 of FIG. 16, a semiconductor material 1602 is formed over the SOI substrate 101. The semiconductor material 1602 contacts the base layer 102 and covers the insulator liner structure 114. In some embodiments, the semiconductor material 1602 is, for example, polysilicon or some other suitable semiconductor material. In some embodiments, the semiconductor material 1602 is formed by way of a deposition process (e.g., PVD, CVD, PE-CVD, low pressure CVD (LPCVD), ALD). In some embodiments, the semiconductor material 1602 completely fills the space between a first portion 114x and a second portion 114y of the insulator liner structure 114.

Figure 17A:
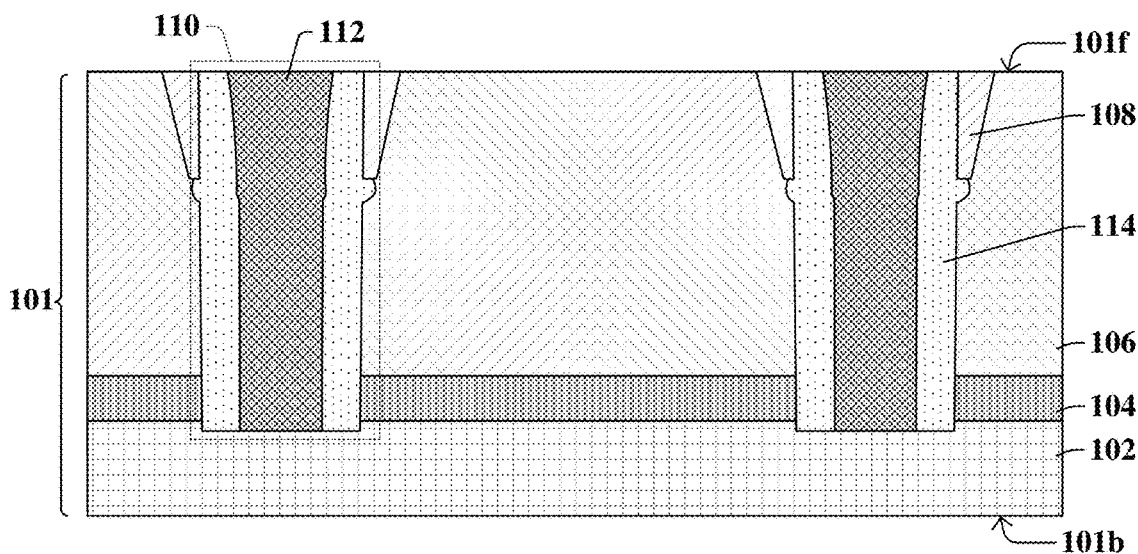

As shown in cross-sectional view 1700A of FIG. 17A, in some embodiments, a fifth removal process is performed to remove portions of the semiconductor material (1602 of FIG. 16) arranged over the frontside 101f of the SOI substrate 101. The remaining semiconductor material (1602 of FIG. 16) is a semiconductor core structure 112 that extends from the frontside 101f of the SOI substrate 101 to the base layer 102 of the SOI substrate 101. Further, in some embodiments, the fifth removal process also removes the protection structure (901 of FIG. 16) and any other layers arranged over the frontside 101f of the SOI substrate 101. In some embodiments, the fifth removal process is a planarization process, such as, for example, chemical mechanical planarization (CMP). In other embodiments, the fifth removal process may comprise etching (e.g., wet, dry) processes, for example. After the fifth removal process, a deep trench isolation (DTI) structure 110 is formed that comprises the insulator liner structure 114 surrounding the semiconductor core structure 112. Upper portions of the DTI structure 110 are surrounded by the STI structure 108. Further, the DTI structure 110 extends completely through the active layer 106 and the insulator layer 104 of the SOI substrate 101 such that the semiconductor core structure 112 directly contacts the base layer 102 of the SOI substrate 101.

Figure 17B:
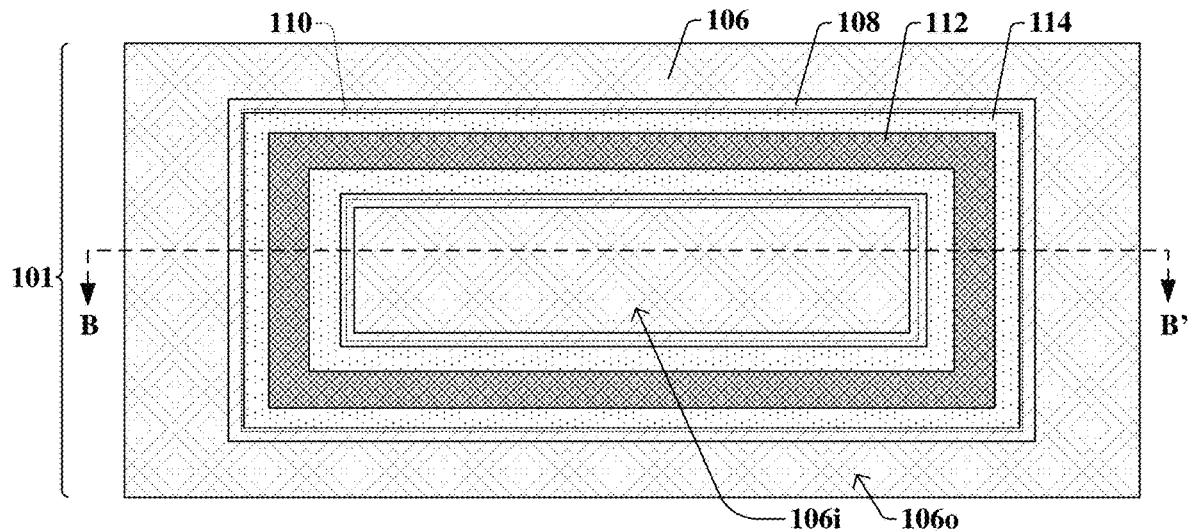

FIG. 17B illustrates a top-view 1700B of some embodiments of the DTI structure 110 after the fifth removal process. In some embodiments, the cross-sectional view 1700A of FIG. 17A may correspond to cross-section line BB' of FIG. 17B.

As shown in the top-view 1700B of FIG. 17B, in some embodiments, the DTI structure 110 is surrounded by the STI structure 108. Further, the DTI structure 110 may be a continuously connected ring-like structure. From the top-view 1700B, the DTI structure 110 may continuously and completely separate the inner region 106*i* of the SOI substrate 101 from the outer region 106*o* of the SOI substrate 101.

Figure 18:
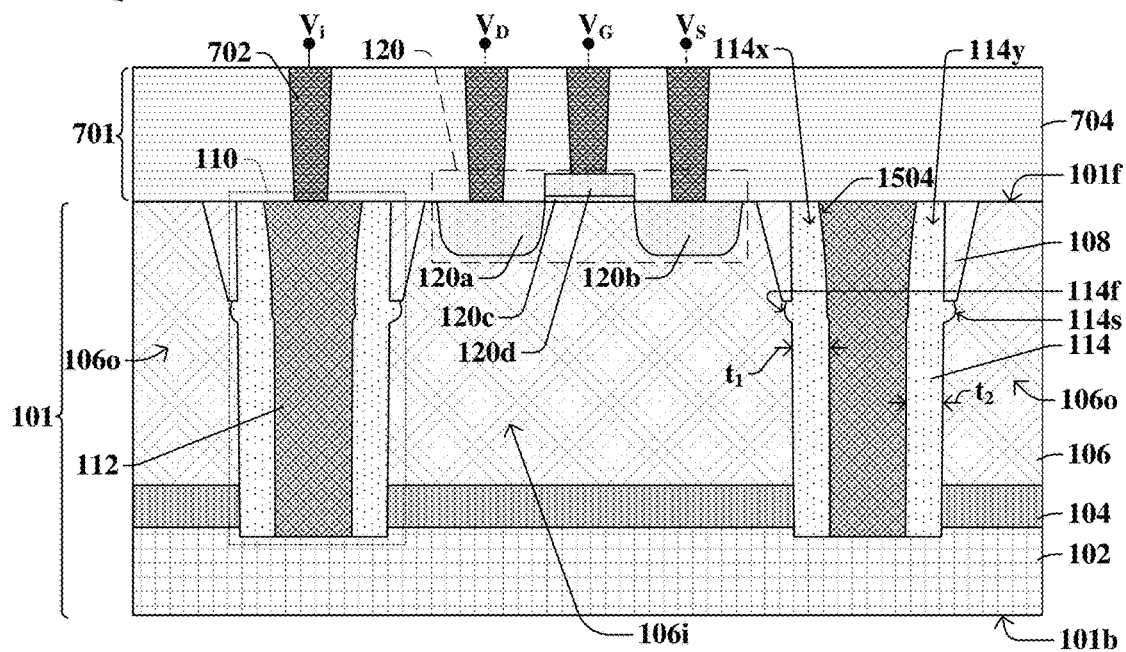

As shown in cross-sectional view 1800 of FIG. 18, in some embodiments, a semiconductor device 120 may be formed on the frontside 101*f* of the SOI substrate 101. The semiconductor device 120 may be arranged on the inner region 106*i* of the active layer 106, such that the DTI structure 110 and the STI structure 108 completely and continuously surround the semiconductor device 120. In some embodiments, the semiconductor device 120 may be or comprise a transistor device such as a metal oxide semiconductor field effect transistor (MOSFET), whereas in other embodiments, for example, a bipolar complementary metal oxide semiconductor double diffused metal oxide semiconductor (BCD) device comprising multiple transistor devices. In some embodiments, the semiconductor device 120 may comprise at least a drain region 120*a*, a source region 120*b*, and a gate electrode 120*d* arranged over a gate dielectric layer 120*c* and between the drain and source regions 120*a*, 120*b*. The semiconductor device 120 may be manufactured using common manufacturing methods such as deposition of layers, photolithography, and etching processes.

Further, in some embodiments, a lower interconnect structure 701 comprising contact vias 702 within a dielectric structure 704 may be formed over the frontside 101*f* of the SOI substrate 101. In some embodiments, at least one of the contact vias 702 may be coupled to the semiconductor core structure 112 to couple the semiconductor core structure 112 to an isolation voltage terminal $V_I$. Further, in some embodiments, at least one of the contact vias 702 may couple the drain region 120*a* to a drain voltage terminal $V_D$, the gate electrode 120*d* to a gate voltage terminal $V_G$, and the source region 120*b* to a source voltage terminal $V_S$. The lower interconnect structure 701 may be formed by way of a damascene process (e.g., steps of deposition, photolithography, and removal processes) in some embodiments.

In some embodiments, the dielectric structure 704 may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the contact vias 702 may comprise a conductive material such as aluminum, tungsten, copper, or some other suitable material. The lower interconnect structure 701 is formed after the formation of the semiconductor device 120.

In some embodiments, the semiconductor device 120 may operate at voltages greater than 100 Volts. The DTI structure 110 and the STI structure 108 may prevent the operating voltages of the semiconductor device 120 from leaking from the inner region 106*i* of the active layer 106 to other devices arranged on the outer region 106*o* of the active layer 106. For example, in some embodiments, the isolation voltage terminal $V_I$, may ground the semiconductor core structure 112 of the DTI structure 110, thereby grounding the base layer 102 of the SOI substrate 101 to provide electrical isolation for the semiconductor device 120.

Further, the STI structure 108 and the insulator liner structure 114 prevent the high-voltage bias (e.g., greater than 100 Volts) from leaking and degrading other surrounding devices, in some embodiments. In some embodiments, the first portion 114*x* of the insulator liner structure 114 has a first thickness $t_1$, and the second portion 114*y* of the insulator liner structure 114 has a second thickness $t_2$. The first and second thicknesses $t_1$, $t_2$ are smaller in areas of the insulator liner structure 114 near the frontside 101*f* of the SOI substrate 101 than near the backside 101*b* of the SOI substrate 101 due to the fourth removal process (1502 of FIG. 15). However, near the frontside 101*f* of the SOI substrate 101, the insulator liner structure 114 is surrounding by the STI structure 108, which comprises an insulator and/or dielectric material like the insulator liner structure 114. Further, below the STI structure 108 and closer to the frontside 101*f* of the SOI substrate 101 than the backside 101*b* of the SOI substrate 101 are the first and second protrusions 114*f*, 114*s*. In some embodiments, the first and second protrusions 114*f*, 114*s* compensate for the curved upper sidewalls 1504 of the insulator liner structure 114. Thus, the first and second protrusions 114*f*, 114*s* ensure that the insulator liner structure 114 has high enough first and second thicknesses $t_1$, $t_2$ such that the breakdown voltage of portions of the insulator liner structure 114 arranged below the STI structure 108 is higher than the voltage biases (e.g., greater than 100 Volts) produced by the semiconductor device 120 during operation. Therefore, breakdown of the insulator liner structure 114 is prevented, and the DTI structure 110 and STI structure 108 may effectively electrically isolate the semiconductor device 120 on the inner region 106*i* of the active layer 106 from devices on the outer region 106*o* of the active layer 106.

Figure 19:
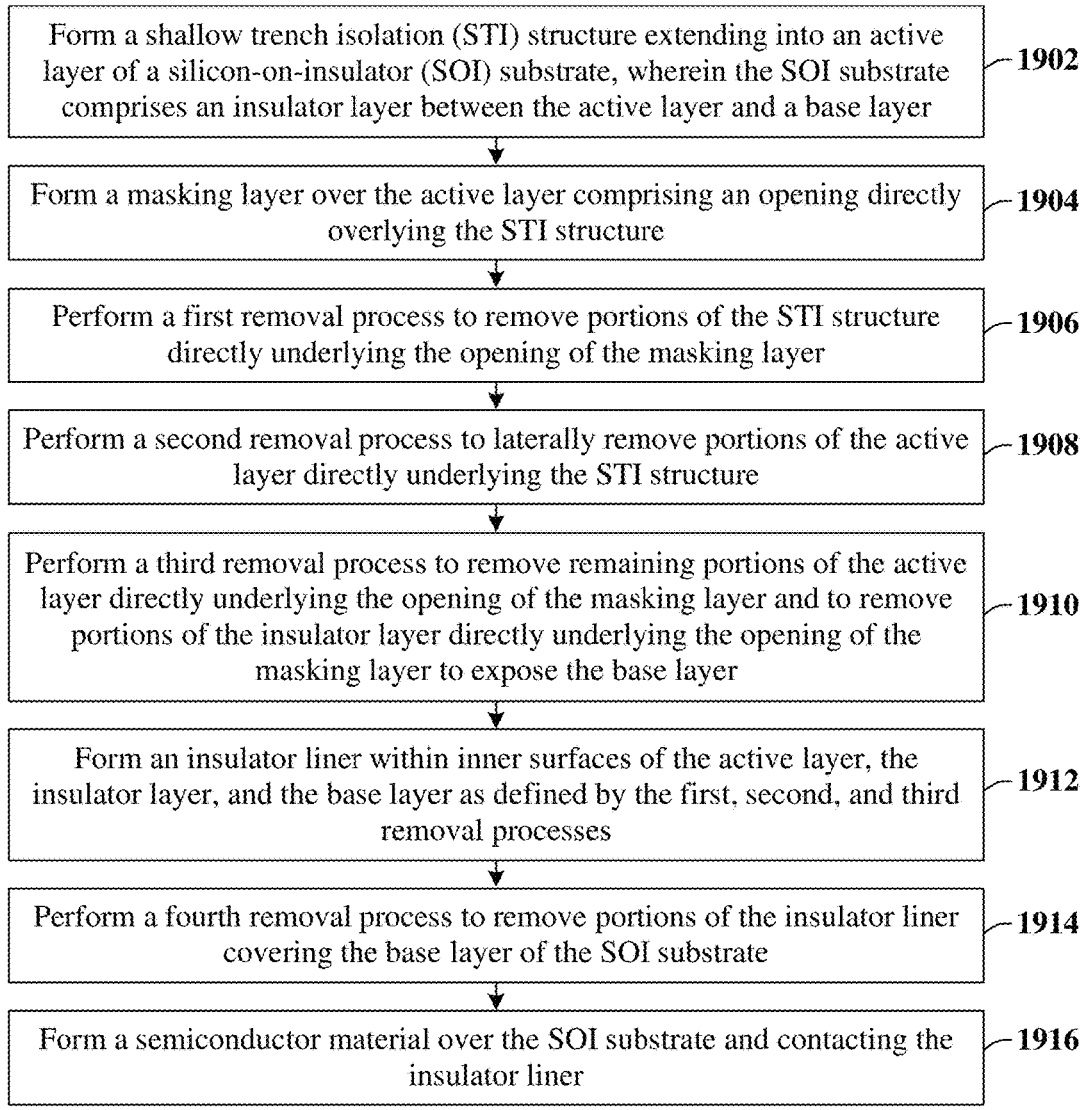
FIG. 19 illustrates a flow diagram of some embodiments of a method describing FIGS. 8A-18.

FIG. 19 illustrates a flow diagram of some embodiments of a method 1900 of forming an integrated chip having a DTI structure.

While method 1900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1902, a shallow trench isolation (STI) structure is formed and extends into an active layer of a silicon-on-insulator (SOI) substrate. The SOI substrate comprises an insulator layer between the active layer and a base layer. FIG. 8A illustrates a cross-sectional view 800A of some embodiments corresponding to act 1902.

At act 1904, a masking layer is formed over the active layer and comprises an opening directly overlying the STI structure. FIG. 10 illustrates a cross-sectional view 1000 of some embodiments corresponding to act 1904.

At act 1906, a first removal process is performed to remove portions of the STI structure directly underlying the opening of the masking layer. FIG. 11 illustrates a cross-sectional view 1100 of some embodiments corresponding to act 1906.

At act 1908, a second removal process is performed to laterally remove portions of the STI structure that directly underlie the STI structure. FIG. 12 illustrates a cross-sectional view 1200 of some embodiments corresponding to act 1908.

At act 1910, a third removal process is performed to remove remaining portions of the active layer directly underlying the opening of the masking layer and to remove portions of the insulator layer directly underlying the opening of the masking layer to expose the base layer. FIG. 13A illustrates a cross-sectional view 1300A of some embodiments corresponding to act 1910.

At act 1912, an insulator liner is formed within inner surfaces of the active layer, the insulator layer, and the base layer as defined by the first, second, and third removal processes. FIG. 14 illustrates a cross-sectional view 1400 of some embodiments corresponding to act 1912.

At act 1914, a fourth removal process is performed to remove portions of the insulator liner covering the base layer of the SOI substrate. FIG. 15 illustrates a cross-sectional view 1500 of some embodiments corresponding to act 1914.

At act 1916, a semiconductor material is formed over the SOI substrate and contacting the insulator liner. FIG. 16 illustrates a cross-sectional view 1600 of some embodiments corresponding to act 1916.

Therefore, the present disclosure relates to a method of manufacturing a deep trench isolation structure that uses an isotropic etch to ensure an insulator liner structure of the deep trench isolation structure is reliable for electrical isolation of surrounding devices.

Accordingly, in some embodiments, the present disclosure relates to an integrated chip, comprising: a silicon-on-insulator (SOI) substrate comprising an insulator layer between an active layer and a base layer; a semiconductor device disposed on a frontside of the SOI substrate; a shallow trench isolation (STI) structure on the frontside of the SOI substrate; a semiconductor core structure continuously surrounding the semiconductor device and extending from the frontside of the SOI substrate towards a backside of the SOI substrate in a first direction, wherein the semiconductor core structure extends through the STI structure; and a first insulator liner portion and a second insulator liner portion respectively surrounding a first outermost sidewall of the semiconductor core structure and a second outermost sidewall of the semiconductor core structure, wherein the first insulator liner portion comprises a first protrusion that is arranged between the STI structure and the insulator layer, wherein the first protrusion extends away from the first outermost sidewall of the semiconductor core structure in a second direction different than the first direction, and wherein the second insulator liner portion comprises a second protrusion that is arranged between the STI structure and the insulator layer, wherein the second protrusion extends away from the second outermost sidewall of the semiconductor core structure in a third direction opposite to the second direction.

In other embodiments, the present disclosure relates to an integrated chip, comprising: a base layer; an active layer arranged over the base layer; an insulator layer separating the active layer from the base layer; a shallow trench isolation (STI) structure extending from a top surface of the active layer towards the insulator layer; and a deep trench isolation (DTI) structure continuously separating an inner region of the active layer from an outer region of the active layer, wherein the DTI structure extends through the STI structure, through the active layer, and into the base layer, and wherein the DTI structure comprises: a semiconductor core structure extending from the active layer to the base layer, and an insulator liner structure covering outermost sidewalls of the semiconductor core structure, wherein the insulator liner structure and the semiconductor core structure directly contact the base layer, and wherein the insulator liner structure has varying widths at different heights of the insulator liner structure and has a maximum width at a height between the STI structure and the insulator layer.

In yet other embodiments, the present disclosure relates to a method of forming a deep trench isolation structure in a substrate, the method comprising: forming a shallow trench isolation (STI) structure that extends into an active layer of a silicon-on-insulator (SOI) substrate; forming a masking layer over the active layer of the SOI substrate, wherein the masking layer comprises an opening that directly overlies the STI structure; performing a first removal process to remove portions of the STI structure that directly underlie the opening of the masking layer, thereby exposing the active layer of the SOI substrate; performing a second removal process to laterally remove portions of the active layer below the STI structure; performing a third removal process to remove remaining portions of the active layer of the SOI substrate and an insulator layer of the SOI substrate that directly underlie the opening of the masking layer, thereby exposing a base layer of the SOI substrate; forming an insulator liner layer within inner surfaces of the active layer, the insulator layer, and the base layer of the SOI substrate as defined by the first, second, and third removal processes; performing a fourth removal process to remove portions of the insulator liner layer covering the base layer of the SOI substrate; and forming a semiconductor material over the SOI substrate and contacting the insulator liner layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a substrate;
   a shallow trench isolation (STI) structure extending into the substrate; and
   a deep trench isolation (DTI) structure extending through the STI structure, wherein the DTI structure comprises a protrusion that protrudes laterally from a sidewall of the DTI structure to a location directly under the STI structure;
   wherein the DTI structure comprises a semiconductor core structure directly contacting semiconductor material of the substrate at a bottom surface of the semiconductor core structure, and further comprises a dielectric liner structure laterally separating the semiconductor core structure from the substrate, and wherein the dielectric liner structure defines the protrusion.

2. The integrated chip according to claim 1, wherein the protrusion directly contacts a bottom surface of the STI structure.

3. The integrated chip according to claim 1, wherein the protrusion is closer to a bottom surface of the STI structure than to a bottom surface of the DTI structure.

4. The integrated chip according to claim 1, wherein the protrusion coincides with a maximum width of the DTI structure.

5. The integrated chip according to claim 1, wherein the DTI structure has a symmetrical cross-sectional profile.

6. The integrated chip according to claim 1, wherein the substrate is a silicon-on-insulator (SOI) substrate, and wherein the DTI structure extends to an insulator layer of the SOI substrate.

7. An integrated chip, comprising:
a substrate;
a shallow trench isolation (STI) structure inset into a top surface of the substrate; and
a deep trench isolation (DTI) structure extending through the STI structure, wherein the DTI structure wraps around a bottom corner of the STI structure.

8. The integrated chip according to claim 7, wherein the STI structure has an additional bottom corner on an opposite side of the DTI structure as the bottom corner, and wherein the DTI structure wraps around the additional bottom corner from a sidewall of the STI structure to a bottom surface of the STI structure.

9. The integrated chip according to claim 7, wherein the DTI structure has a first width at a first elevation elevated relative to the bottom corner and further has a second width at a second elevation recessed relative to the bottom corner, and wherein the second width is greater than the first width.

10. The integrated chip according to claim 9, wherein the first elevation is closer to the bottom corner than to the top surface of the substrate, and wherein the second elevation is closer to the bottom corner than to a bottom surface of the DTI structure.

11. The integrated chip according to claim 7, wherein the DTI structure comprises a semiconductor core structure, and further comprises a dielectric liner structure localized to sidewalls of the semiconductor core structure and separating the sidewalls from the substrate.

12. The integrated chip according to claim 11, wherein the semiconductor core structure directly contacts semiconductor material of the substrate at a bottom surface of the semiconductor core structure, and wherein the dielectric liner structure extends from the bottom surface of the semiconductor core structure to a top surface of the DTI structure and wraps around the bottom corner of the STI structure from a sidewall of the STI structure to a bottom surface of the STI structure.

13. The integrated chip according to claim 7, further comprising:
a semiconductor device overlying and partially defined by the substrate, wherein the STI structure and the DTI structure extend in a closed path to surround and demarcate a device region of the substrate on which the semiconductor device is arranged.

14. An integrated chip, comprising:
a substrate;
a shallow trench isolation (STI) structure extending into a top of the substrate; and
a deep trench isolation (DTI) structure extending through the STI structure and comprising a semiconductor core structure and an insulator liner structure separating the semiconductor core structure from the STI structure and the substrate;
wherein a thickness of the insulator liner structure increases along a height of the DTI structure, towards the STI structure from a location recessed relative to a bottom surface of the STI structure, and wherein the thickness extends transverse to the height.

15. The integrated chip according to claim 14, wherein the location is closer to the bottom surface of the STI structure than to a bottom surface of the DTI structure.

16. The integrated chip according to claim 14, wherein the thickness of the insulator liner structure further increases along the height of the DTI structure, from a top surface of the STI structure to another location elevated relative to the bottom surface of the STI structure.

17. The integrated chip according to claim 14, wherein a bottom surface of the semiconductor core structure is level with a bottom surface of the insulator liner structure.

18. The integrated chip according to claim 14, wherein the insulator liner structure has a curved surface facing a width-wise center of the DTI structure and at a same elevation as the location.

19. The integrated chip according to claim 14, wherein a width of the semiconductor core structure increases from a same elevation as the location to an elevation level with a top surface of the substrate.

20. The integrated chip according to claim 14, wherein the STI structure separates a top portion of the DTI structure from the substrate.

* * * * *